US008509348B2

(12) United States Patent
Ford

(10) Patent No.: US 8,509,348 B2
(45) Date of Patent: *Aug. 13, 2013

(54) UP-CONVERTED AND AMPLIFIED TRANSMISSION SIGNAL USING LOG-ANTILOG

(75) Inventor: James Arthur Ford, Laguna Hills, CA (US)

(73) Assignee: Broadcom Corporation, Irvine, CA (US)

(*) Notice: Subject to any disclaimer, the term of this patent is extended or adjusted under 35 U.S.C. 154(b) by 38 days.

This patent is subject to a terminal disclaimer.

(21) Appl. No.: 13/097,659

(22) Filed: Apr. 29, 2011

(65) Prior Publication Data

US 2011/0200142 A1   Aug. 18, 2011

Related U.S. Application Data

(63) Continuation of application No. 11/983,557, filed on Nov. 8, 2007, now Pat. No. 7,965,790.

(51) Int. Cl.
*H04K 1/02* (2006.01)
*H04L 25/03* (2006.01)
*H04L 25/49* (2006.01)

(52) U.S. Cl.
USPC ........... 375/297; 375/295; 375/296; 375/263; 375/300; 455/108; 455/110; 455/118

(58) Field of Classification Search
USPC ............... 375/297, 295, 296, 268, 300, 271; 455/110, 118, 108
See application file for complete search history.

(56) References Cited

U.S. PATENT DOCUMENTS

| 4,057,756 | A | * | 11/1977 | Ley et al. | 324/76.21 |
| 4,766,795 | A | * | 8/1988 | Takeuchi | 84/696 |
| 7,965,790 | B2 | * | 6/2011 | Ford | 375/297 |
| 2004/0213357 | A1 | * | 10/2004 | Komiak | 375/316 |

\* cited by examiner

*Primary Examiner* — Phuong Phu
(74) *Attorney, Agent, or Firm* — Farjami & Farjami LLP

(57) ABSTRACT

According to one exemplary embodiment, a method for producing an up-converted and amplified transmission signal comprises performing a logarithmic transformation of an input transmission signal to form a logarithmically transformed transmission signal, adding the logarithmically transformed transmission signal to a logarithmic local oscillator signal to form a sum signal, and performing an antilogarithmic transformation of the sum signal to produce the up-converted and amplified transmission signal. In one embodiment, a log-antilog circuit for producing an up-converted and an amplified transmission signal comprises a transmission log block configured to receive an input transmission signal and to provide a logarithmically transformed transmission signal as a transmission log block output, and an antilog block coupled to the transmission log block. The antilog block is configured to receive a sum signal of the transmission log block output and a logarithmic local oscillator signal.

20 Claims, 7 Drawing Sheets

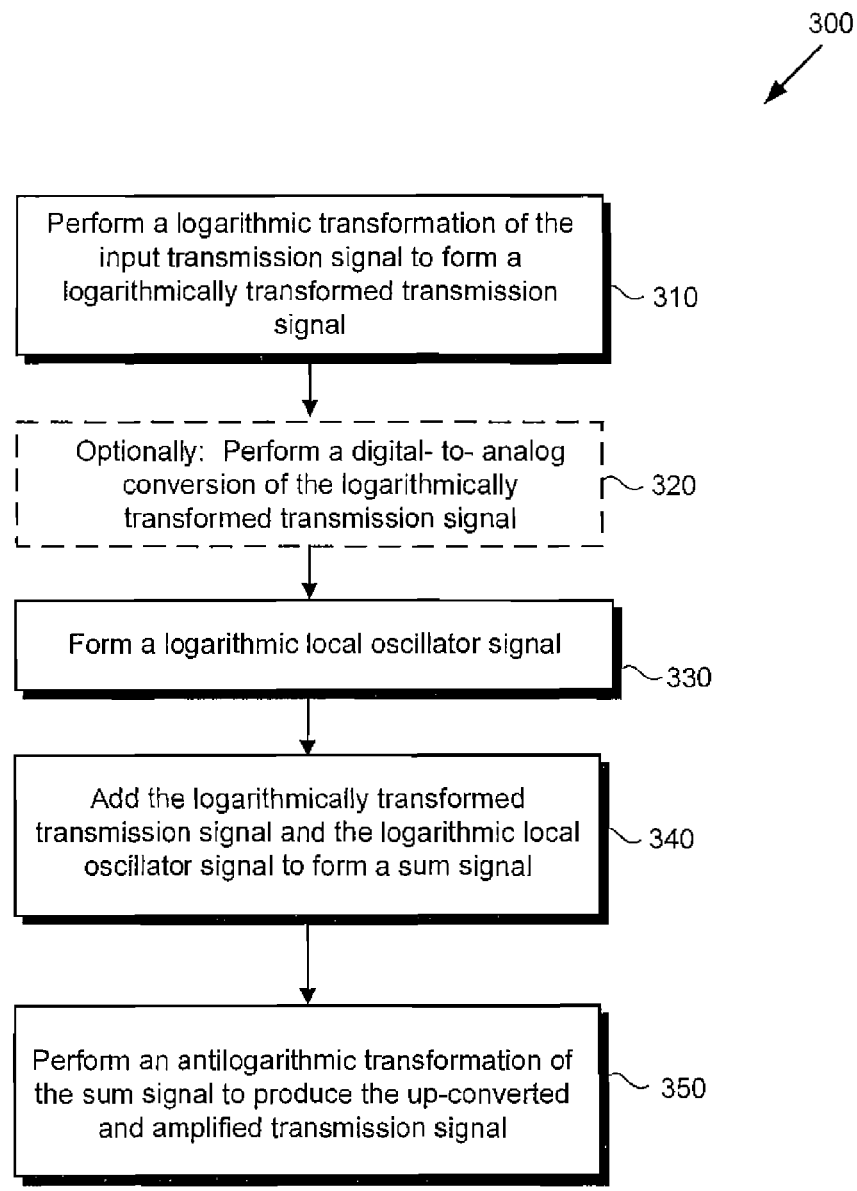

US 8,509,348 B2

UP-CONVERTED AND AMPLIFIED TRANSMISSION SIGNAL USING LOG-ANTILOG

This is a continuation of application Ser. No. 11/983,557 filed Nov. 8, 2007 now U.S. Pat. No. 7,965,790.

BACKGROUND OF THE INVENTION

1. Field of the Invention

The present invention is generally in the field of electronic circuits and systems. More specifically, the present invention is in the field of electronic communications circuits and systems.

2. Background Art

Mixers are typically used in transmitting systems to, for example, up-convert an input baseband or intermediate frequency (IF) signal prior to transmission. In a conventional mixing circuit, the mixer itself may be paired with a power amplifier. In to that configuration the mixer output may be fed into a discrete power amplifier to impart a desirable transmission power level to the up-converted transmission signal. As is known in the art, however, the performance of power amplifiers involves a trade-off between efficiency and the linear response of the amplifier, where improvement in one characteristic results in an undesirable deterioration of the other.

The consequences of the irreconcilability of linearity and efficiency in a power amplifier has significant implications for mobile communication devices utilizing a transmitting system, for example, as part of a transceiver. Because mobile communication devices, such as mobile telephones, typically rely on a battery for power, inefficiency in a power amplifier undesirably shortens battery life. Utilizing a high efficiency power amplifier, on the other hand, while advantageously enhancing battery life, may, due to its reduced linearity, lead to undesirable transmission anomalies, and in extreme cases may result in unintended transmission at frequencies not authorized for public use by the Federal Communication Commission (FCC).

Thus, there is a need in the art for a solution capable of compensating for the performance limitations of a conventional transmitter, that enables up-conversion and amplification of a transmission signal while advantageously providing improved linearity and conserving operational power.

SUMMARY OF THE INVENTION

A log-antilog circuit and method for producing an up-converted and amplified transmission signal, substantially as shown in and/or described in connection with at least one of the figures, and as set forth more completely in the claims.

BRIEF DESCRIPTION OF THE DRAWINGS

FIG. 3 is a flowchart of a method for producing an up-converted and amplified transmission signal, according to one embodiment of the present invention.

DETAILED DESCRIPTION OF THE INVENTION

The present invention is directed to a log-antilog circuit and method for producing an up-converted and amplified transmission signal. Although the invention is described with respect to specific embodiments, the principles of the invention, as defined by the claims appended herein, can obviously be applied beyond the specifically described embodiments of the invention described herein. Moreover, in the description of the present invention, certain details have been left out in order to not obscure the inventive aspects of the invention. The details left out are within the knowledge of a person of ordinary skill in the art.

The drawings in the present application and their accompanying detailed description are directed to merely exemplary embodiments of the invention. To maintain brevity, other embodiments of the invention, which use the principles of the present invention are not specifically described in the present application and are not specifically illustrated by the present drawings.

Figure 1:
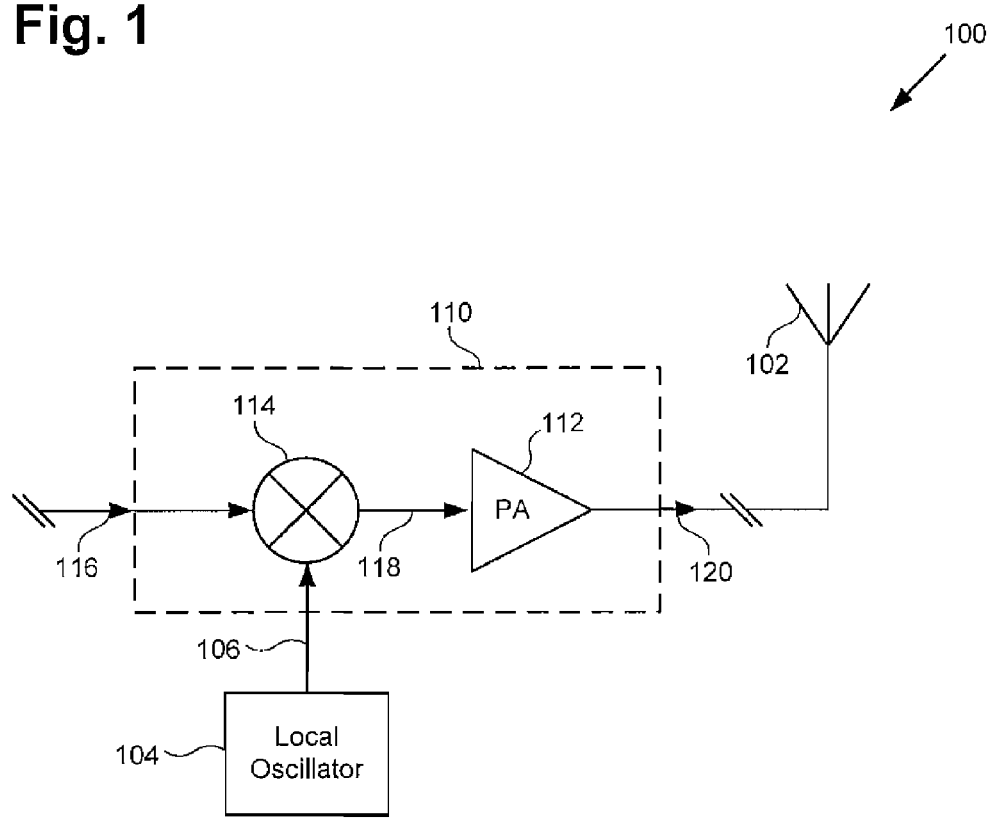
FIG. 1 is a block diagram of a conventional system for up-converting and amplifying a transmission signal.

FIG. 1 is a block diagram of a conventional system for up-converting and amplifying a transmission signal. FIG. 1 shows transmitting system 100 comprising antenna 102, local oscillator 104 providing local oscillator signal 106, and mixer circuit 110. Also shown in FIG. 1 are mixer circuit components including power amplifier (PA) 112 and mixer 114. In addition, FIG. 1 includes input transmission signal 116, being provided as an input to mixer circuit 110, mixer output 118, and mixer circuit output signal 120. Additional elements comprised by transmitting system 100 are not shown in FIG. 1 for purposes of clarity and economy of presentation. Transmitting system 100 may be utilized in a transmitter supporting cellular telephone communication, or a mobile or stationary transmitter operating at radio frequency (RF), for example.

In a conventional approach to implementing a transmitting system, such as transmitting system 100 in FIG. 1, mixer circuit 110 is typically utilized to up-convert input transmission signal 116 from baseband or an intermediate frequency (IF), to a transmit frequency such as RF, and to provide the up-converted transmission signal as mixer circuit output signal 120. Up-conversion of input transmission signal 116 is facilitated by amplification of mixer output 118 by PA 112. The up-converted and amplified transmission signal is provided as mixer circuit output signal 120, whereupon it may undergo additional signal processing steps, for example, highpass filtering, before being fed to antenna 102 for transmission.

Ideally, the performance of PA 112 would be optimized to balance the linearity requirements imposed by transmitting system 100 with efficiency needs corresponding to available system power. In some implementations, however, in particular where operating power is provided by a modular power supply such as a battery, and transmission power requirements are high, those competing interests may be nearly irreconcilable using a conventional transmitting system. Implementation of a conventional transmitting system, such as transmitting system 100, in a battery operated mobile communication device transmitting at a remote distance from a communications base station, for example, may have undesirable consequences. As previously described, those undesirable consequences may include premature depletion of battery power, the production of spurious or anomalous transmission signals, or problems related to both those drawbacks associated with conventional transmitting systems.

Figure 2:
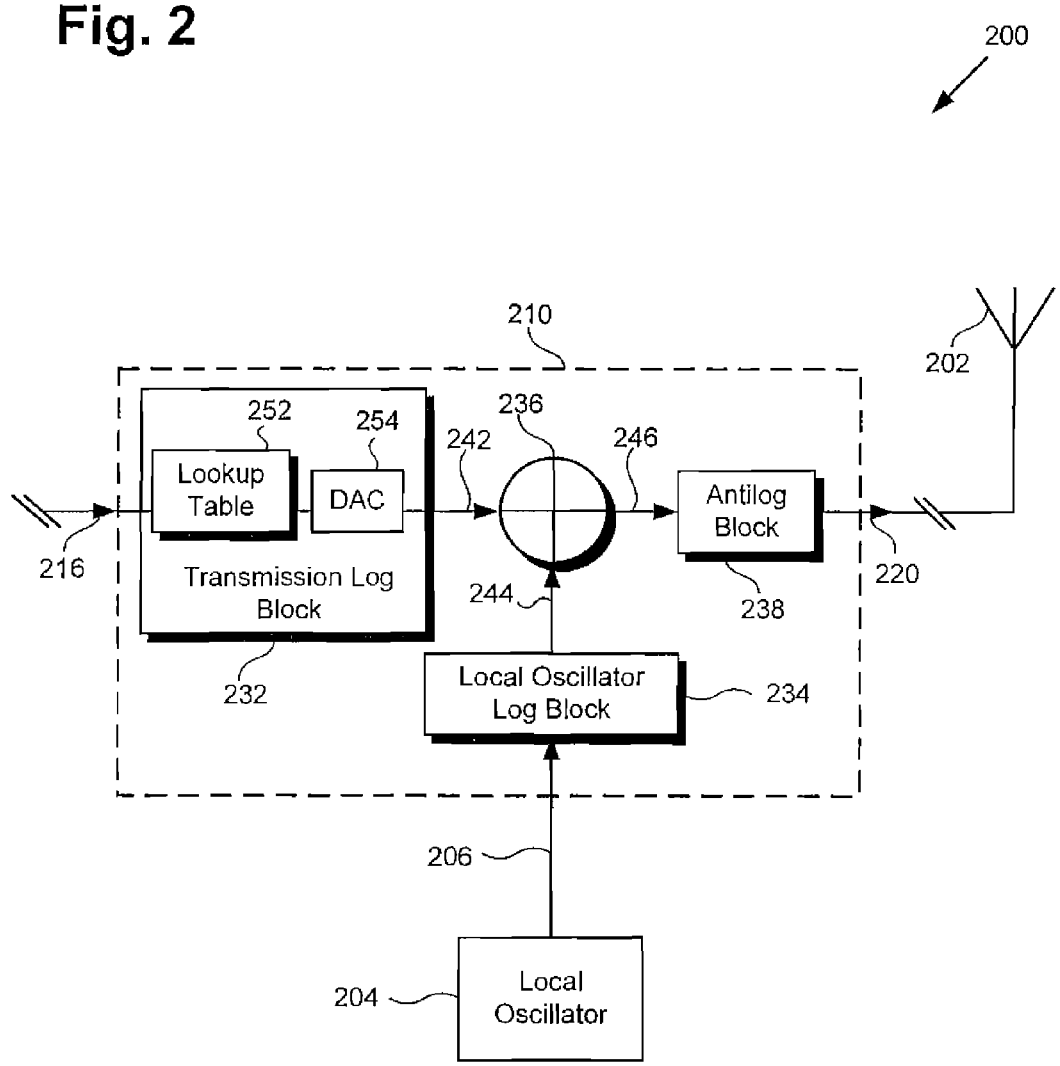
FIG. 2 is a block diagram showing a log-antilog circuit for producing an up-converted and amplified transmission signal, according to one embodiment of the present invention.

FIG. 2 is a block diagram showing a log-antilog circuit for producing an up-converted and amplified transmission signal, according to one embodiment of the present invention, capable of overcoming the drawbacks associated with the conventional implementation described previously in relation to FIG. 1. FIG. 2 shows transmitting system 200 comprising antenna 202, and local oscillator 204 providing local oscillator signal 206, corresponding respectively to receiving system 100 comprising antenna 102, and local oscillator 104 providing local oscillator signal 106, in FIG. 1.

FIG. 2 also includes log-antilog circuit 210, which replaces the conventional implementation of mixer circuit 110 shown in FIG. 1. Log-antilog circuit 210 comprises transmission log block 232, local oscillator log block 234, adder 236, and antilog block 238, which, collectively, replace PA 112 and mixer 114 of mixer circuit 110, in FIG. 1. Transmission log block 232, in FIG. 2, is shown to include lookup table 252 and digital-to-analog converter (DAC) 254. Also present in FIG. 2 are input transmission signal 216, and log-antilog circuit output signal 220 being fed to antenna 202, corresponding respectively to input transmission signal 116 and mixer circuit output signal 120, in FIG. 1. Moreover, FIG. 2 shows logarithmically transformed transmission signal 242, logarithmic local oscillator signal 244, and sum signal 246, having no analogues in the conventional receiving system shown in FIG. 1. As was the case in FIG. 1, additional elements comprised by transmitting system 200 are not shown in FIG. 2 for purposes of clarity and brevity.

Transmitting system 200 may be utilized in a transmitter supporting cellular telephone communication, other types of mobile transmitters operating at RF, or a stationary communication system, for example. In one embodiment, one or more versions of log-antilog circuit 210 may be utilized in a transceiver, such as an RF transceiver used in a mobile communication device. For the purposes of the present discussion, let us assume that the exemplary implementation shown in FIG. 2 is utilized to up-convert and amplify input transmission signal 216 in an RF transmitter, from either baseband or IF, to a transmit frequency in a range from approximately 0.8 GHz to approximately 2.1 GHz.

The operation of log-antilog circuit 210 in FIG. 2 is further explained in combination with FIG. 3, which shows flowchart 300 describing the steps, according to one embodiment of the present invention, for producing an up-converted and amplified transmission signal. Certain details and features have been left out of flowchart 300 that are apparent to a person of ordinary skill in the art. For example, a step may comprise one or more substeps or may involve specialized equipment or materials, as known in the art. While steps 310 through 350 indicated in flowchart 300 are sufficient to describe one embodiment of the present invention, other embodiments of the invention may utilize steps different from those shown in flowchart 300.

Referring to step 310 of flowchart 300, in conjunction with FIG. 2, step 310 comprises performing a logarithmic transformation of input transmission signal 216 received as an input to transmission log block 232, to form a logarithmically transformed transmission signal. Logarithmic transformation of input transmission signal 216 is performed in FIG. 2 by transmission log block 232.

Logarithmic transformation of input transmission signal 216, at step 310, permits omission from log-antilog circuit 210, of PA 112 and mixer 114, in FIG. 1. This is possible due to the mathematical properties of logarithmic functions, according to which addition of two logarithmic functions corresponds to a sum function containing the product of the arguments of the added functions as a sum function argument, according to the following logarithmic identity:

$$\log(A_1) + \log(A_2) = \log(A_1 \times A_2) \tag{Equation 1};$$

where $A_1$ is the argument of the first logarithmic function, $A_2$ is the argument of the second logarithmic function, and ($A_1 \times A_2$) is the argument of the sum function. Consequently, an operation equivalent to mixing of a signal logarithmically transformed at step 310 of flowchart 300, may be achieved through simple addition of that logarithmically transformed communication signal with a logarithmic local oscillator signal formed in step 330.

Input transmission signal 216 in the present embodiment shown in FIG. 2 is a digital input transmission signal, and transmission log block 232 is configured to form a logarithmic transformation of digital input transmission signal 216. However, in a different embodiment, an analog input transmission signal could be used, where log block 232 would be replaced with an appropriate transmission log block. Because, as is known in the art, it is impracticable to provide local oscillator signal 206 as a digital signal at RF, however, in embodiments in which input transmission signal 216 is received as a digital input transmission signal, DAC 254 may be implemented to convert the logarithmically transformed signal from a digital signal to an analog signal in optional step 320. Thus, in the present embodiment, input transmission signal 216 is represented as a digital input transmission signal that is first logarithmically transformed into a digital logarithmically transformed transmission signal and subsequently converted to an analog logarithmically transformed transmission signal. In another embodiment, the digital input transmission signal is converted into an analog transmission signal prior to logarithmic transformation, where a transmission log block other than the presently illustrated transmission log block 232 is used to perform the logarithmic transformation of the analog signal. Regardless of the order of the DAC conversion and logarithmic transformation, both operations occur prior to the later adding step 340.

Continuing with step 330 of flowchart 300, step 330 comprises forming a logarithmic local oscillator signal. Formation of a logarithmic local oscillator signal is achieved in log-antilog circuit 210 of FIG. 2 by logarithmic transformation of local oscillator signal 206 by local oscillator log block 234. In another embodiment, log-antilog circuit 210 may be provided with a logarithmic local oscillator signal by a logarithmic local oscillator signal generator (not shown in FIG. 2), in which case log-antilog circuit 210 would not require local oscillator log block 234.

Proceeding with step 340 of flowchart 300, step 340 comprises adding logarithmically transformed transmission signal 242 and logarithmic local oscillator signal 244 to form sum signal 246. In FIG. 2, step 340 is implemented using adder 236. Although the embodiment of FIG. 2 includes adder 236, in one embodiment logarithmically transformed transmission signal 242 and logarithmic local oscillator signal 244 take the form of current signals, so that adding those signals may be accomplished by merely passing them into a common circuit node coupling the outputs of transmission log block 232 and local oscillator log block 234. In that embodiment, adder 236 can be omitted from log-antilog circuit 210.

Referring to step 350 of flowchart 300, step 350 comprises performing an antilogarithmic transformation of the sum signal formed in step 340 to produce the up-converted and amplified transmission signal. In FIG. 2, antilog transformation of sum signal 246 is performed by antilog block 238. As described previously, sum signal 246 corresponds to a logarithmic signal having, as its argument, the product of input transmission signal 216 and local oscillator signal 206. Antilogarithmic transformation of sum signal 246 results in the multiplied, or mixed, signal products of input transmission signal 216 and local oscillator signal 206 emerging as log-antilog circuit output signal 220, including a desired up-converted and amplified transmission signal which may be provided to antenna 202 for transmission. It is noted that although the present embodiment shows log-antilog circuit output signal 220 being fed to antenna 202, in another exemplary implementation, log-antilog circuit output signal 220 may be provided to another transmission medium, such as a communication cable, for instance.

Figure 4A:
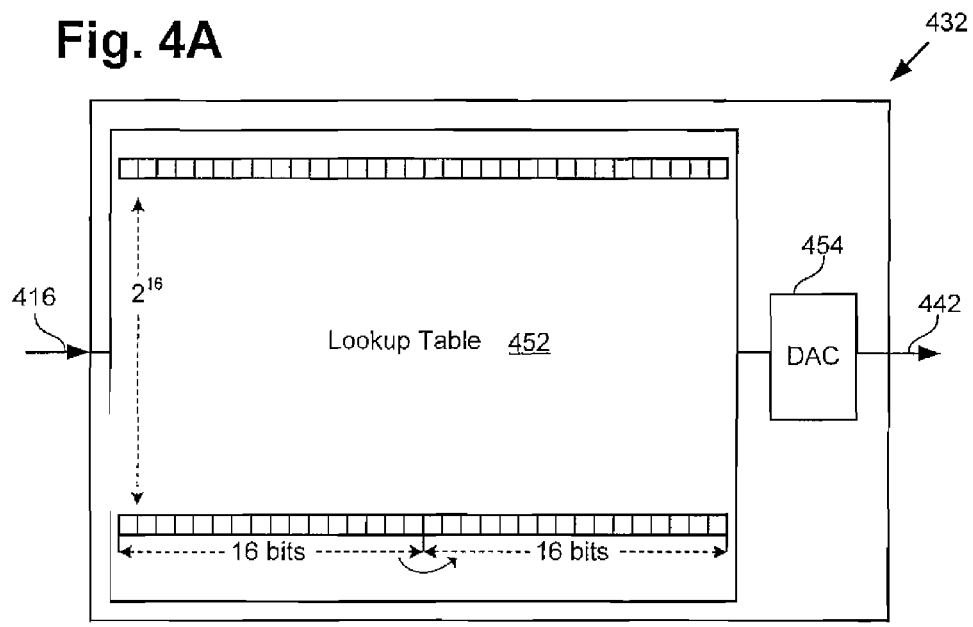
FIG. 4A shows a block diagram of an exemplary transmission log block for use to with a digital input transmission signal, according to one embodiment of the present invention.
Figure 4B:
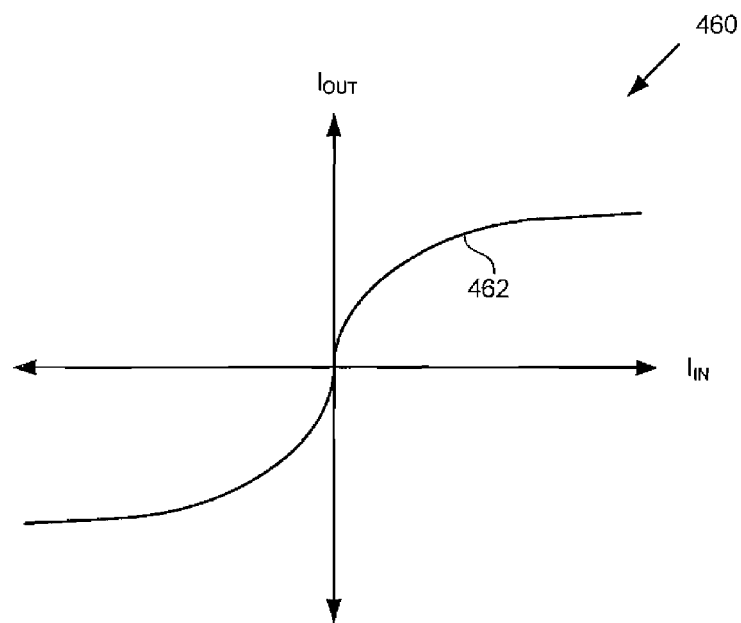
FIG. 4B is a graph showing an exemplary logarithmic transfer function produced by the transmission log block embodiment of FIG. 4A.

Moving on to FIGS. 4A and 4B, FIG. 4A shows a block diagram of an exemplary transmission log block for use with a digital input transmission signal, according to one embodiment of the present invention. In FIG. 4A, transmission log block 432 receiving input transmission signal 416 as an input and providing logarithmically transformed transmission signal 442 as an output, corresponds to transmission log block 232 receiving input transmission signal 216 and providing logarithmically transformed transmission signal 242, in FIG. 2. As further shown in FIG. 4A, transmission log block 432 comprises lookup table 452 and DAC 454, corresponding respectively to lookup table 252 and DAC 254, in FIG. 2.

In the embodiment of FIG. 4A, input transmission signal 416 is supplied as a digital input transmission signal at baseband or IF. Logarithmic transformation of the digital input transmission signal may be performed by utilizing lookup table 452. For example, as shown in FIG. 4A, where an input digital signal comprises a 16-bit signal, to a lookup table including $2^{16}$ lines is capable of matching each 16-bit input to a 16-bit logarithmically transformed output on a one-to-one basis. As a result, lookup table 452 can be utilized to provide a digital logarithmically transformed transmission signal in response to transmission log block 432 receiving a digital input as input transmission signal 416. Subsequent conversion of the digital signal provided by lookup table 452, by means of DAC 454, as is known in the art, provides an analog signal as logarithmically transformed transmission signal 442.

Although in the embodiment of FIGS. 2 and 4A, respective transmission log blocks 232 and 432 utilize a lookup table to perform logarithmic transformation of a digital input transmission signal, in other embodiments, other suitable techniques may be used to achieve the signal transformation, such as implementation of a discrete transform algorithm, for example. Moreover, although the present exemplary embodiment shows lookup table 452 configured to transform a 16-bit digital input signal, in other embodiments, lookup table 452 may be implemented so as to transform digital signals comprising more or fewer bits. Thus, in other embodiments, lookup table 452 may comprise more or fewer than $2^{16}$ lines.

As previously explained, input transmission signal 216, in FIG. 2, can be an analog signal as well as a digital signal. When input transmission signal 216 is an analog signal, transmission log block 232 will not be implemented with lookup table 252 and DAC 254. Exemplary implementations of a log block for logarithmic transformation of an analog transmission signal include, for example, a multi-stage amplifier or an anti-parallel diode pair configuration. These examples, i.e. a multi-stage amplifier and an anti-parallel diode pair configuration, are described on page 14, line 13 through page 15, line 19, and page 18, line 8 through page 19, line 4, of co-pending patent application Ser. No. 11/975,209, filed on Oct. 17, 2007. That co-pending application is hereby incorporated fully by reference into the present application. It is noted that the aforementioned exemplary log blocks are equally suitable for implementation as transmission log block 232, in FIG. 2 of the present application, when input transmission signal 216 is an analog signal, and as local oscillator log block 234, to perform logarithmic transformation of local oscillator signal 206.

FIG. 4B is a graph showing an exemplary logarithmic transfer function produced by the transmission log block embodiment of FIG. 4A. Graph 460, in FIG. 4B, shows an exemplary output signal ($I_{OUT}$), as a function of an input signal ($I_{IN}$). It is noted that although in the present embodiment input signal and output signal $I_{OUT}$ are represented as current signals, in other embodiments, corresponding input and output signals may take the form of voltage signals, for example. Input signal $I_{IN}$, shown on the x-axis of graph 460, corresponds to input transmission signals 216 and 416, in FIGS. 2 and 4A, respectively, while $L_{OUT}$, shown on the y-axis of graph 460, corresponds to logarithmically transformed transmission signals 242 and 442, in those respective figures. The performance of transmission log block 232 over a range of input signal strengths is shown by log transfer curve 462.

Log transfer curve 462 may be seen to correspond to the exemplary mathematical transfer function given by:

$$y = \mathrm{signum}(x)[\log(|x|+1)] \qquad \text{(Equation 2)}$$

As is shown by graph 460 and Equation 2, passage of input signal $I_{IN}$ into transmission log block 232 results in an output signal $I_{OUT}$ that is a logarithmic function of the input, i.e., output signal $I_{OUT}$ is a logarithmic transformation of input signal $I_{IN}$. Implementation of a local oscillator log block 234, in FIG. 2, produces a similar logarithmic transformation of local oscillator signal 206, resulting in formation of logarithmic local oscillator signal 244. In the embodiment of FIG. 2, the logarithmic transformations produced by transmission log block 232 and local oscillator log block 234 enable addition of logarithmically transformed transmission signal 242 and logarithmic local oscillator signal 244 according to Equation 1.

Figure 5A:
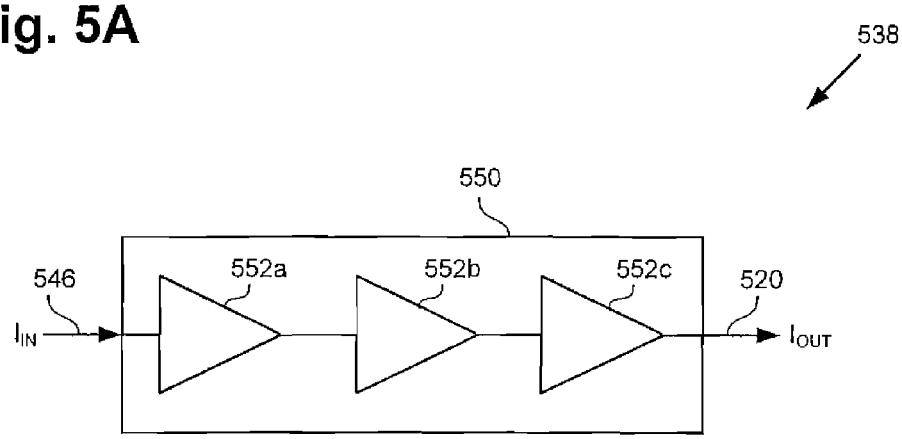
FIG. 5A shows an exemplary antilog transform circuit suitable for use in the antilog block of FIG. 2, according to one embodiment of the present invention.

FIG. 5A shows an exemplary antilog transform circuit suitable for use in the antilog block shown in FIG. 2, according to one embodiment of the present invention. In FIG. 5A, antilog block 538 receiving sum signal 546 as an input and providing log-antilog circuit output signal 520 as an output, corresponds to antilog block 238 receiving sum signal 246 and providing log-antilog circuit output signal 220, in FIG. 2. As shown in FIG. 5A, antilog block 538 comprises antilog transform circuit 550, which includes a multi-stage amplifier comprising substantially identical amplifiers 552a, 552b, and 552c in series. Although the present exemplary embodiment shows the multi-stage amplifier of antilog transform circuit 550 having three substantially identical stages, in other embodiments more stages may be present.

In the embodiment of FIG. 5A, sum signal 546 is supplied as a current input $I_{IN}$ formed from additive combination of logarithmically transformed transmission signal 242 and logarithmic local oscillator. Successive amplifications of periodic current input $I_{IN}$, performed by amplifiers 552a, 552b, and 552c, transform sum signal 546 into log-antilog circuit output signal 520, which comprises the up-converted and amplified transmission signal originally delivered to log-antilog circuit 210, in FIG. 2, as baseband or IF input transmission signal 216.

It is noted that logarithmic local oscillator signal 244 is provided as a periodic function having a frequency corresponding to local oscillator signal 206. Logarithmically transformed transmission signal 242 may be similarly periodic, due either to periodicity present in an analog input transmission signal corresponding to input transmission signal 216, or to a periodicity imposed on a digital logarithmically transformed transmission signal by DAC 254. As a result, sum signal 246 may be received as input to antilog block 538 as a periodic function (further shown in FIG. 5C). The up-converted and amplified transmission signal appearing as log-antilog circuit output signal 520, may then be provided as sinusoidal current output $I_{OUT}$ (further shown in subsequent FIG. 5D).

Figure 5B:
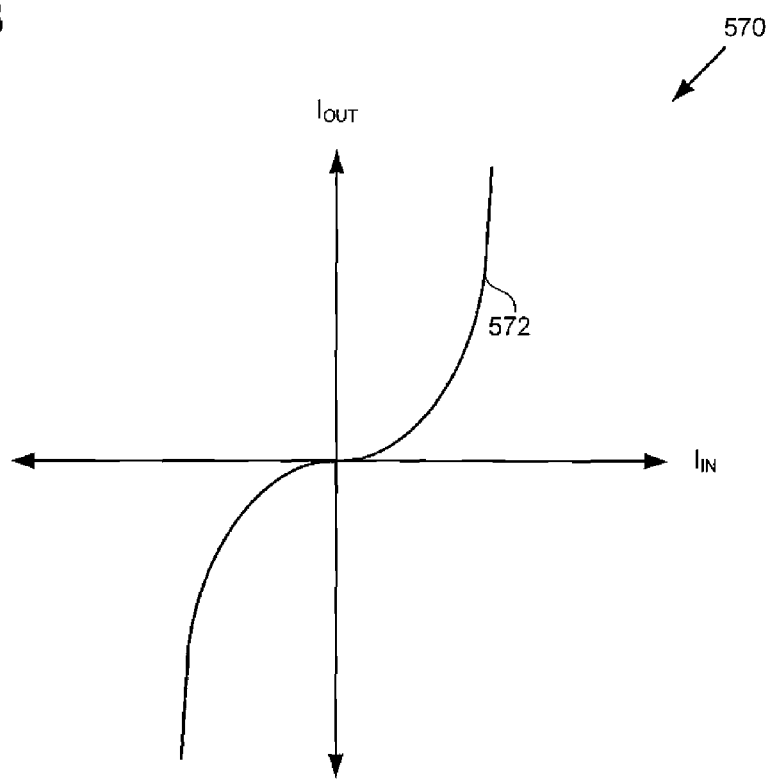
FIG. 5B is a graph showing an exemplary antilogarithmic transfer function produced by the antilog transform circuit of FIG. 5A.

FIG. 5B is a graph showing an exemplary antilogarithmic transfer function provided by antilog transform circuit 550 of FIG. 5A. Graph 570, in FIG. 5B, shows an exemplary output signal ($I_{OUT}$), as a function of an input signal ($I_{IN}$). Input signal $I_{IN}$, shown on the x-axis of graph 560, corresponds to sum signals 246 and 546, in FIGS. 2 and 5A, respectively, while $I_{OUT}$, shown on the y-axis of graph 560, corresponds to log-antilog circuit output signals 220 and 520, in those respective figures. The performance of antilog transform circuit 550 over a range of input signal strengths is shown by antilog transfer curve 572.

Figure 5C:
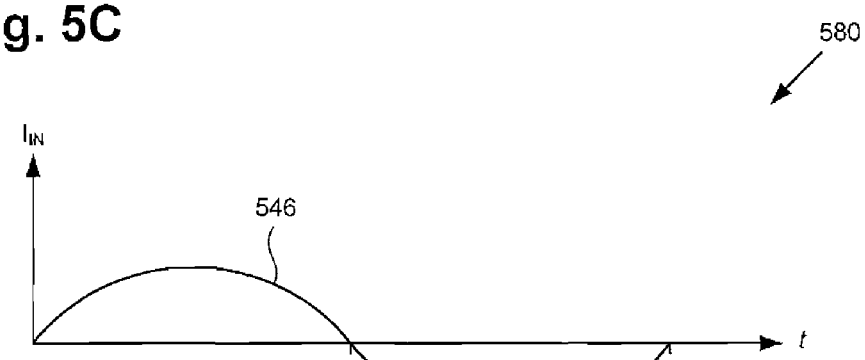
FIG. 5C is a graph showing an exemplary input signal to the antilog transform circuit of FIG. 5A.
Figure 5D:
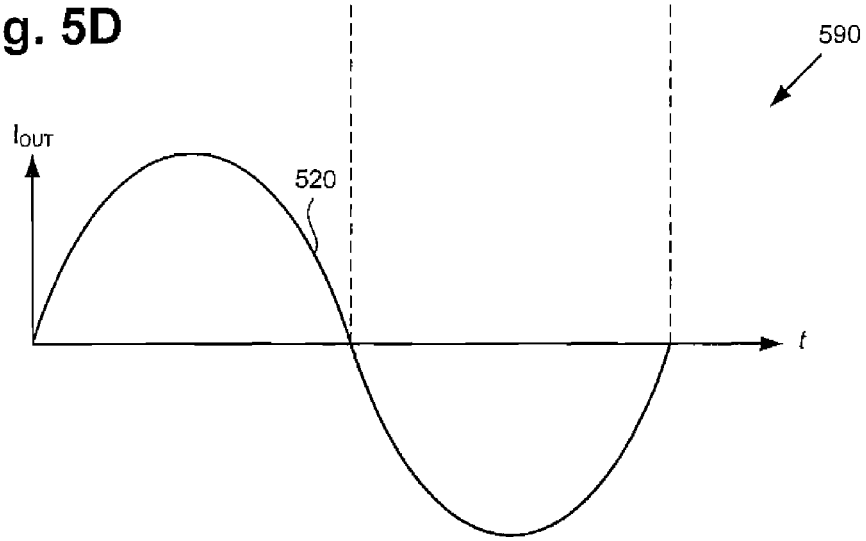
FIG. 5D is a graph showing an exemplary antilogarithmic transformation of the signal of FIG. 5C.

FIG. 5C is a graph showing an exemplary input sum signal to antilog transform circuit 550 of FIG. 5A. Comparison of FIG. 5C with FIG. 5D, which is a graph showing an exemplary antilogarithmic transformation of the input sum signal of FIG. 5C, reveals the result of passing a periodic logarithmic input signal through an antilog transform circuit having a performance curve similar to that of antilog transfer curve 572, in FIG. 5B. Graph 580, in FIG. 5C shows the amplitude of sum signal 546 as a function of time. Antilogarithmic transformation of sum signal 546, in FIG. 5C, by antilog transform circuit 550 having antilog transfer curve 572, shown in FIGS. 5A and 5B, respectively, produces log-antilog circuit output signal 520, expressed as a function of time in graph 590, of FIG. 5D. As shown by FIGS. 5C and 5D, antilogarithmic transformation of periodic sum signal 546 produces an amplified and substantially sinusoidal output signal having substantially the same frequency as periodic input sum signal 546.

Thus, implementation of a transmitting system utilizing log-antilog circuit 210 of FIG. 2, in place of conventional mixer circuit 110, in FIG. 1, advantageously produces an up-converted and amplified transmission signal without recourse to PA 112 or conventional mixer 114. In an alternative implementation, as part of another embodiment of the present invention, the output of antilog block 238, in FIG. 2, may be further amplified by means of an optional power amplifier. However, even where an optional power amplifier is utilized in conjunction with the exemplary transmission log blocks and antilog blocks disclosed herein, the amplification, linearity, and efficiency demands placed on that optional power amplifier can be significantly relaxed, compared to conventional implementations, due to the amplification provided by log-antilog circuit 210. In effect, the present invention enables elimination of PA 112 entirely, or, alternatively, use of a lower power PA capable of providing optimal linearity without producing the power drain on an operational power supply seen in conventional mixer circuit implementations.

Figure 6:
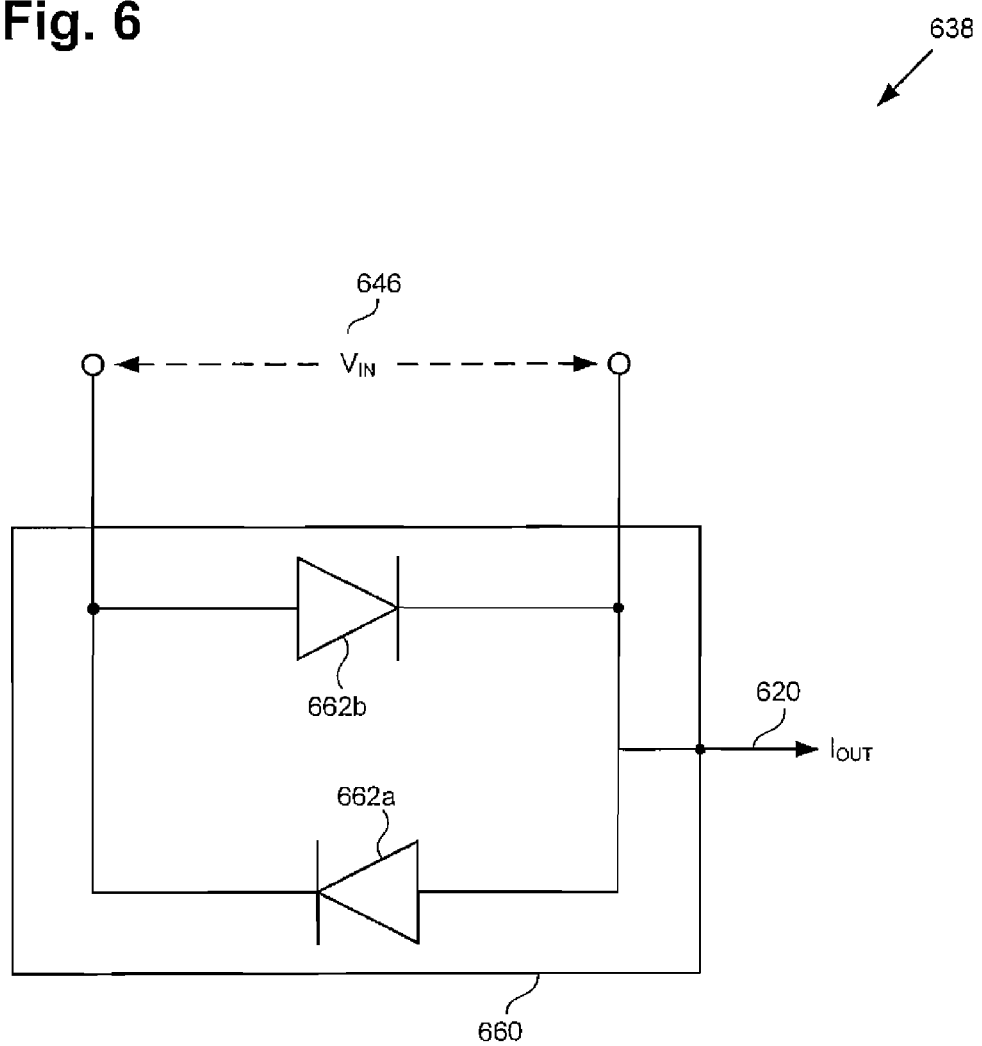
FIG. 6 shows an exemplary antilog transform circuit suitable for use in the antilog block of FIG. 2, according to another embodiment of the present invention.

FIG. 6 shows an exemplary antilog transform circuit suitable for use in the antilog block shown in FIG. 2, according to another embodiment of the present invention. In FIG. 6, antilog block 638 receiving sum signal 646 as an input and providing log-antilog circuit output signal 620 as an output, corresponds to antilog block 238 receiving sum signal 246 and providing log-antilog circuit output signal 220, in FIG. 2. As shown in FIG. 6, antilog block 638 comprises antilog transform circuit 660, which includes an anti-parallel pair of substantially identical diodes 662a and 662b. As in FIG. 5A, in the embodiment of FIG. 6, log-antilog circuit output signal 620 is provided as a current output. Unlike the previous embodiment, however, antilog transform circuit 660 receives sum signal 646 as a voltage input.

In its various embodiments, the present invention's log-antilog circuit and method for producing an up-converted and amplified transmission signal, can be utilized in a transmitting system in, for example, a wireless communications device, a mobile telephone, a Bluetooth enabled device, a computer, an RF transceiver, a personal digital assistant (PDA), or in any other kind of system, device, component or module utilized as a transmitter in modern electronics applications.

By introducing a log-antilog circuit and method for producing an up-converted and amplified transmission signal, the present disclosure describes a signal processing implementation which advantageously utilizes a mathematical property of logarithmic functions to support additive signal mixing and amplification. By replacing a conventional power amplifier and mixer combination with a log-antilog circuit, the various embodiments of the present invention provide linear amplification without incurring the power cost associated with highly linear transmitter power amplifiers. As a result, the present disclosure enables a solution that compensates for the performance limitations of a conventional transmitter power amplifier by enabling up-conversion and amplification of a transmission signal while advantageously providing improved linearity and conserving operational power.

From the above description of the invention it is manifest that various techniques can be used for implementing the concepts of the present invention without departing from its scope. Moreover, while the invention has been described with specific reference to certain embodiments, a person of ordinary skill in the art would recognize that changes can be made in form and detail without departing from the spirit and the scope of the invention. The described embodiments are to be considered in all respects as illustrative and not restrictive. It should also be understood that the invention is not limited to the particular embodiments described herein, but is capable of many rearrangements, modifications, and substitutions without departing from the scope of the invention.

Thus, a log-antilog circuit and method for producing an up-converted and amplified transmission signal have been described.

The invention claimed is:

1. A method for producing a sum signal in a log-antilog circuit, said method comprising:

forming a logarithmic transmission signal, said logarithmic transmission signal being periodic and having a first frequency;

adding said logarithmic transmission signal to a logarithmic local oscillator signal to form said sum signal, said logarithmic local oscillator signal being periodic and having a second frequency.

2. The method of claim 1, further comprising performing a logarithmic transformation of an input transmission signal to form said logarithmic transmission signal.

3. The method of claim 1, further comprising performing an antilogarithmic transformation of said sum signal to produce an up-converted and amplified transmission signal.

4. The method of claim 2, wherein said input transmission signal comprises a digital input transmission signal.

5. The method of claim 4, further comprising converting said digital input transmission signal to a digital logarithmically transformed transmission signal.

6. The method of claim 4, further comprising converting said digital input transmission signal to a digital logarithmically transformed transmission signal utilizing a lookup table.

7. The method of claim 5, further comprising converting said digital logarithmically transformed transmission signal to an analog logarithmically transformed transmission signal to form said logarithmic transmission signal.

8. The method of claim 3, wherein said up-converted and amplified transmission signal comprises a radio frequency (RF) transmission signal.

9. A log-antilog circuit comprising:
a transmission log block configured to produce a logarithmic transmission signal, said logarithmic transmission signal being periodic and having a first frequency;
an antilog block configured to receive said logarithmic transmission signal and a logarithmic local oscillator signal, said logarithmic local oscillator signal being periodic and having a second frequency.

10. The log-antilog circuit of claim 9, further comprising an adder for adding said logarithmic transmission signal and said logarithmic local oscillator signal to produce a sum signal.

11. The log-antilog circuit of claim 9, further comprising a local oscillator log block configured to receive a local oscillator signal and to produce said logarithmic local oscillator signal.

12. The log-antilog circuit of claim 9, wherein said transmission log block is configured to receive a digital input transmission signal.

13. The log-antilog circuit of claim 9, wherein said transmission log block comprises a lookup table, said lookup table being utilized to produce a digital logarithmically transformed transmission signal.

14. The log-antilog circuit of claim 13, wherein said transmission log block comprises a digital-to-analog converter configured to receive said digital logarithmically transformed transmission signal and to produce said logarithmic transmission signal.

15. The log-antilog circuit of claim 9, wherein said antilog block comprises at least one multi-stage amplifier.

16. The log-antilog circuit of claim 9, wherein said antilog block comprises at least one anti-parallel diode pair.

17. The log-antilog circuit of claim 9, wherein said transmission log block comprises at least one multi-stage amplifier.

18. The log-antilog circuit of claim 9, wherein said transmission log block comprises at least one anti-parallel diode pair.

19. A circuit for producing an up-converted and amplified transmission signal, said circuit comprising:
a transmission log block configured to produce a logarithmic transmission signal;
an antilog block configured to receive said logarithmic transmission signal and a logarithmic local oscillator signal and to produce said up-converted and amplified transmission signal.

20. The circuit of claim 19, further comprising an adder configured to add said logarithmic transmission signal and said logarithmic local oscillator signal and to produce a sum signal to said antilog block.

* * * * *